(12) United States Patent
Venkata et al.

(10) Patent No.: US 7,646,217 B2
(45) Date of Patent: Jan. 12, 2010

(54) PROGRAMMABLE LOGIC DEVICE WITH SERIAL INTERCONNECT

(75) Inventors: Ramanand Venkata, San Francisco, CA (US); Rakesh H. Patel, Cupertino, CA (US); Chong H. Lee, San Ramon, CA (US)

(73) Assignee: Altera Corporation, San Jose, CA (US)

( * ) Notice: Subject to any disclaimer, the term of this patent is extended or adjusted under 35 U.S.C. 154(b) by 8 days.

(21) Appl. No.: 11/539,006

(22) Filed: Oct. 5, 2006

(65) Prior Publication Data

US 2007/0188189 A1 Aug. 16, 2007

Related U.S. Application Data

(60) Provisional application No. 60/753,450, filed on Dec. 22, 2005.

(51) Int. Cl.
*H01L 25/00* (2006.01)
(52) U.S. Cl. .............................. 326/41; 326/37; 326/38; 326/47
(58) Field of Classification Search ............. 326/37–38, 326/41, 47
See application file for complete search history.

(56) References Cited

U.S. PATENT DOCUMENTS

| 6,643,752 B1 * | 11/2003 | Donnelly et al. ............ 711/167 |
| 6,650,140 B2 * | 11/2003 | Lee et al. ....................... 326/39 |
| 6,650,141 B2 * | 11/2003 | Agrawal et al. ............... 326/41 |
| 6,777,979 B1 * | 8/2004 | Zhu et al. ..................... 326/41 |
| 6,888,376 B1 | 5/2005 | Venkata et al. |
| 6,894,530 B1 | 5/2005 | Davidson et al. |
| 7,062,586 B2 * | 6/2006 | Donlin et al. ............... 710/305 |
| 7,276,936 B1 * | 10/2007 | Hoang et al. ................. 326/41 |
| 7,290,201 B1 * | 10/2007 | Edwards ..................... 714/798 |
| 7,301,824 B1 * | 11/2007 | New .................... 365/189.011 |
| 2002/0003435 A1 | 1/2002 | Andrews et al. |
| 2005/0021749 A1 * | 1/2005 | Donlin et al. ............... 709/225 |

FOREIGN PATENT DOCUMENTS

WO  WO2004/095703  11/2004

* cited by examiner

*Primary Examiner*—Rexford N Barnie
*Assistant Examiner*—Jason Crawford
(74) *Attorney, Agent, or Firm*—Ropes & Gray LLP; Jeffrey H. Ingerman

(57) ABSTRACT

In a programmable logic device, some or all of the parallel interconnect resources are replaced by serial interconnect resources within the device. Some or all of the functional blocks on the device are supplemented with serial interfaces. Although this makes the functional blocks more complex, it allows a significant reduction in the area consumed by interconnect resources. This translates into a significant reduction in device power consumption. The serial interfaces may operate synchronously from a global device clock (such as a PLL). In some cases, serial interfaces that are provided in the input/output blocks for external signalling can be omitted because the serial interfaces in the functional blocks can take over the external serial interface function as well, although in those cases the serial interfaces in the functional blocks would have to be more complex because they would have to be able to operate asynchronously with external devices.

19 Claims, 8 Drawing Sheets

PROGRAMMABLE LOGIC DEVICE WITH SERIAL INTERCONNECT

CROSS REFERENCE TO RELATED APPLICATIONS

This claims the benefit of copending, commonly-assigned U.S. Provisional Patent Application No. 60/753,450, filed Dec. 22, 2005, which is hereby incorporated by reference herein in its entirety.

BACKGROUND OF THE INVENTION

This invention relates to a programmable logic device (PLD) in which at least some of the interconnect resources are serial.

PLDs include input/output ("I/O") regions, areas, regions, blocks or other groupings of programmable logic, and programmable interconnect resources that can be used to interconnect areas of programmable logic with each other and with the I/O regions. By properly programming or configuring the programmable logic and the programmable interconnect resources (the I/O regions also may be programmable), a user can configure a PLD to perform a desired function.

The interconnect resources of a PLD may include global interconnect resources that carry signals to and among many different parts of the device, regional interconnect resources that carry signals within a substantial portion, but less than all, of the device, and local interconnect resources that carry signals within groupings of programmable logic. Heretofore, PLD interconnect resources typically have been parallel.

PLDs have been continually increasing in size and capability. However, as the amount of programmable logic on a PLD has increased, the amount of interconnect resources, including both signal lines and switching or routing resources to create desired signal paths, also has increased. In many current PLDs, the interconnect resources may consume as much as 40% or more of the device area.

It would be desirable to be able to reduce the area consumed by interconnect resources in a programmable logic device.

SUMMARY OF THE INVENTION

The present invention reduce the area consumed by interconnect resources in a programmable logic device by providing onboard serial interconnect for at least a portion of the interconnect resources of the device.

The invention is preferably implemented by distributing serial interfaces throughout the programmable logic device, in association with the various portions of the device to which the serial interconnect is to be made available. Of course, whether any particular serial interconnect is used depends on the particulars of a user's logic design, as is the case with any interconnect on a programmable logic device.

Preferably, serial interconnect is provided for signalling between major portions of the programmable logic device. Thus, for example, serial interconnect may be provided for signalling between groupings of programmable logic, but it may not be efficient or worthwhile to provide serial local interconnect. Preferably the local interconnect would remain parallel. For example, in FPGA-type programmable logic devices available from Altera Corporation, of San Jose, Calif., the most basic unit of logic is referred to as a "logic element," or LE, and LEs are grouped into blocks referred to as "logic array blocks," or LABs. In a preferred embodiment of the present invention, local interconnect within a LAB would remain parallel, while at least some of the interconnect between LABs would be serial. Thus, each LAB, or at least some of the LABs, preferably are provided with a serial interface including serializer/deserializer circuitry. Alternatively, even interconnect between LABs might remain parallel, with serial interconnect being provided only among groups of LABs (GOLs).

The provision of serial interconnect according to the invention is not limited to interconnect between various groupings of programmable logic elements. Rather, the invention includes the provision of serial logic between or among any of various portions of the programmable logic device. Those portions could include any kind of functional block in the programmable logic device, including embedded memory blocks, digital signal processing blocks, etc., as well as the I/O regions of the device. Any of those portions could be provided with serial interfaces as discussed above, with serial data paths between them. Moreover, the serial interfaces do not have to be associated with any particular functional unit of the programmable logic device. Rather, it is contemplated that parallel interconnect from various functional portions might lead to a serial interface that is outside any functional portion of the device. In such a case, rather than serving particular functional portions of the programmable logic device, the serial interconnect would serve "portions" of the device in the colloquial sense.

Serial interfaces for serial interconnect between a programmable logic device and outside circuitry or devices is known. The serial interface used for the intra-PLD serial interconnect can be simpler, however, because the various serial interfaces are all on the same device and can share a common clock source and operate synchronously. For example, it is known to provide phase-locked loops (PLLs) as clock sources on programmable logic devices. In a preferred embodiment of the present invention, the programmable logic device includes at least one such PLL. The PLL output preferably is delivered to the various onboard serial interfaces using the existing clock tree to minimize skew and allow synchronous operation.

If, as is preferred, synchronous operation among the onboard serial interfaces is achieved, then the serial interfaces can be simpler than the serial interfaces used for off-device serial signalling. For example, the serial interface could be based on a digital PLL (DPLL). Such interfaces may consume less than about 0.5 mW of power. Therefore, their impact on overall power consumption is small (the overall power consumption of a programmable logic device may be about 15-20W).

The provision of serial data paths allow multiple (e.g., eight or ten) parallel conductors to be replaced by a single conductor. This can result in substantial savings in device area. As mentioned above, interconnect resources can consume as much as about 40% of the device area. A reduction of just 10% in the amount of interconnect resources can lead to a reduction of 40% in the amount of area consumed. One candidate for replacement of parallel interconnect with serial interconnect are conductors for device-wide signals such as clocks, presets and clears.

In addition, as mentioned above, it is common to use serial signalling to communicate with remote devices. As a result, PLD I/O regions have grown into large serial interfaces with large serializer/deserializer circuits. In accordance with the present invention, the I/O regions can be simplified to perform essentially only I/O functions, and the serial data can be routed within the PLD, and serialized or deserialized at the serial interface of the functional region that uses the data. In such an embodiment, however, it may be necessary to operate asynchronously with a remote device, and therefore the serial interface may need to be somewhat more complex than one designed for purely synchronous operation as discussed above.

In addition to saving area, the reduction in the number of lines allows the remaining lines to be spaced further apart (without completely eliminating the saved area). Because power consumption resulting from capacitive coupling is inversely proportional to the spacing, increasing line spacing results in reduced power consumption. Power consumption also may be reduced by the elimination of pipeline registers used to adjust timing on global conductors, which may not be necessary with serial signalling.

Moreover, with parallel interconnect, each intersection between, e.g., horizontal and vertical conductors may be provided with programmable connections to allow signals to be routed between horizontal and vertical conductors. Even if a sparsely-populated connection matrix is provided, significant area and power are consumed by the programmable connections. With serial interconnect, on the other hand, any intersection may be the intersection between one vertical conductor and one horizontal conductor, requiring only one switch (or two if the switches are directional) for communication between the two lines.

Thus, in accordance with the present invention, there is provided a programmable logic device having groupings of programmable logic resources, programmable input/output resources, and programmable interconnect resources for conveying signals among the groupings of programmable logic resources and between the programmable logic resources and the programmable input/output resources. The programmable interconnect resources include at least one serial interconnect between at least two portions of the programmable logic device.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention will now be described with reference to FIGS. 1-6.

Figure 1:
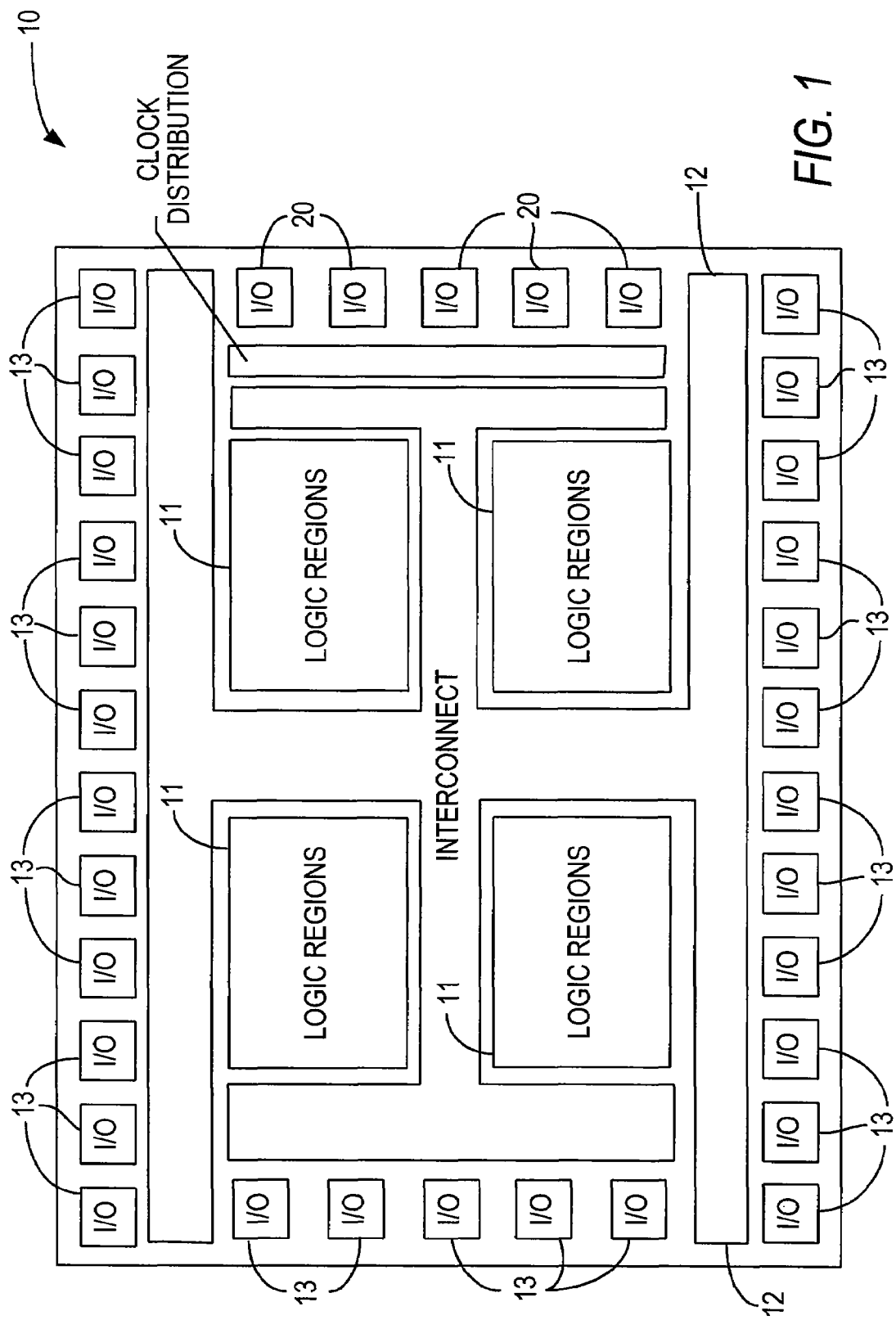
FIG. 1 is a block diagram of a preferred embodiment of a programmable logic device in which the present invention can be used.

PLD 10, shown schematically in FIG. 1, is one example of a device including serial interconnect in accordance with the invention. PLD 10 has a programmable logic core including programmable logic regions 11 accessible to programmable interconnect structure 12. The layout of regions 11 and interconnect structure 12 as shown in FIG. 1 is intended to be schematic only, as many actual arrangements are known to, or may be created by, those of ordinary skill in the art.

PLD 10 also includes a plurality of input/output ("I/O") regions 13. I/O regions 13 preferably are programmable, allowing the selection of one of a number of possible I/O signaling schemes, which may include differential and/or non-differential signaling schemes. Alternatively, I/O regions 13 may be fixed, each allowing only a particular signaling scheme. In some embodiments, a number of different types of fixed I/O regions 13 may be provided, so that while an individual region 13 does not allow a selection of signaling schemes, nevertheless PLD 10 as a whole does allow such a selection.

Figure 2:
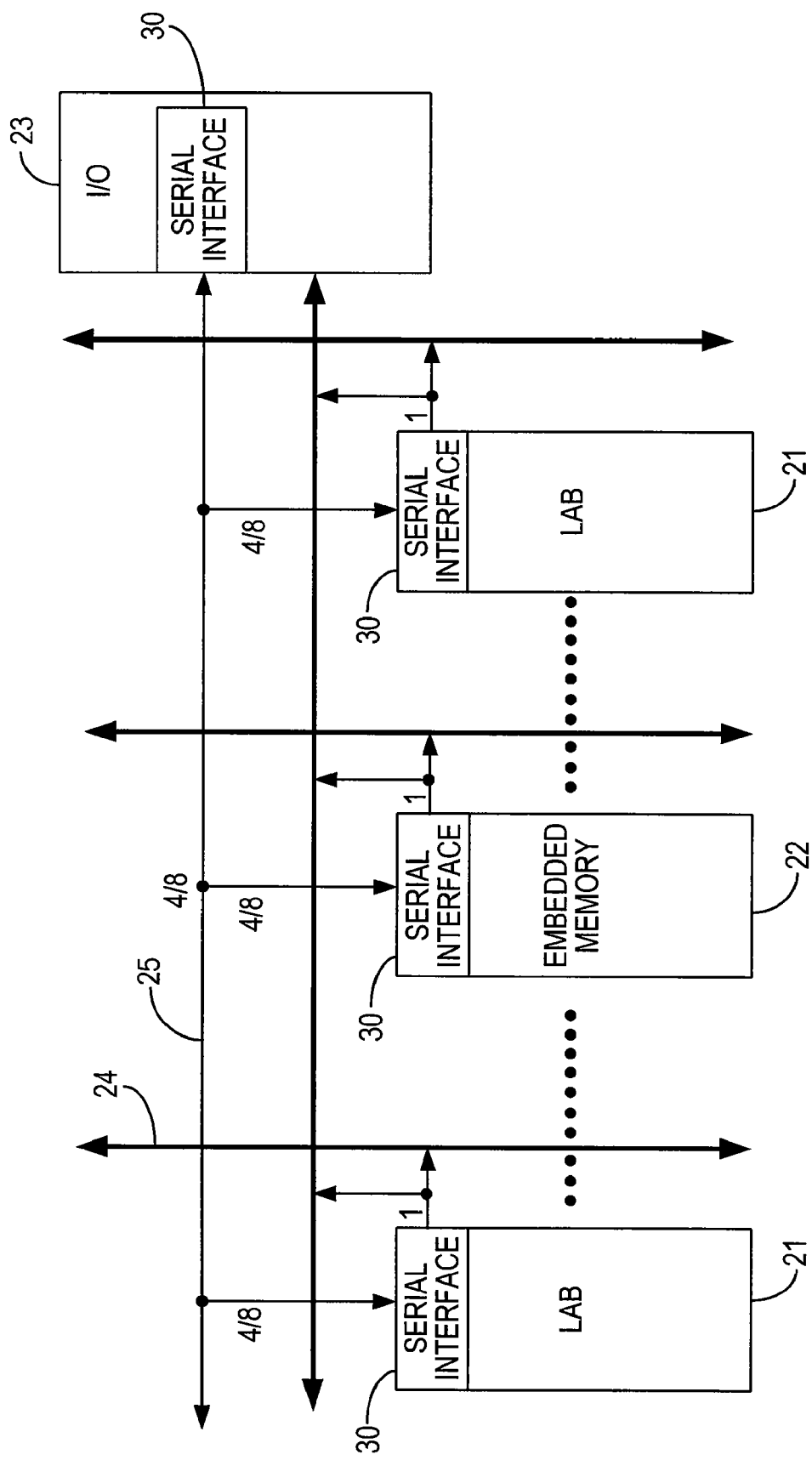
FIG. 2 is a schematic diagram of a representative portion of a programmable logic device incorporating the present invention.
Figure 3:
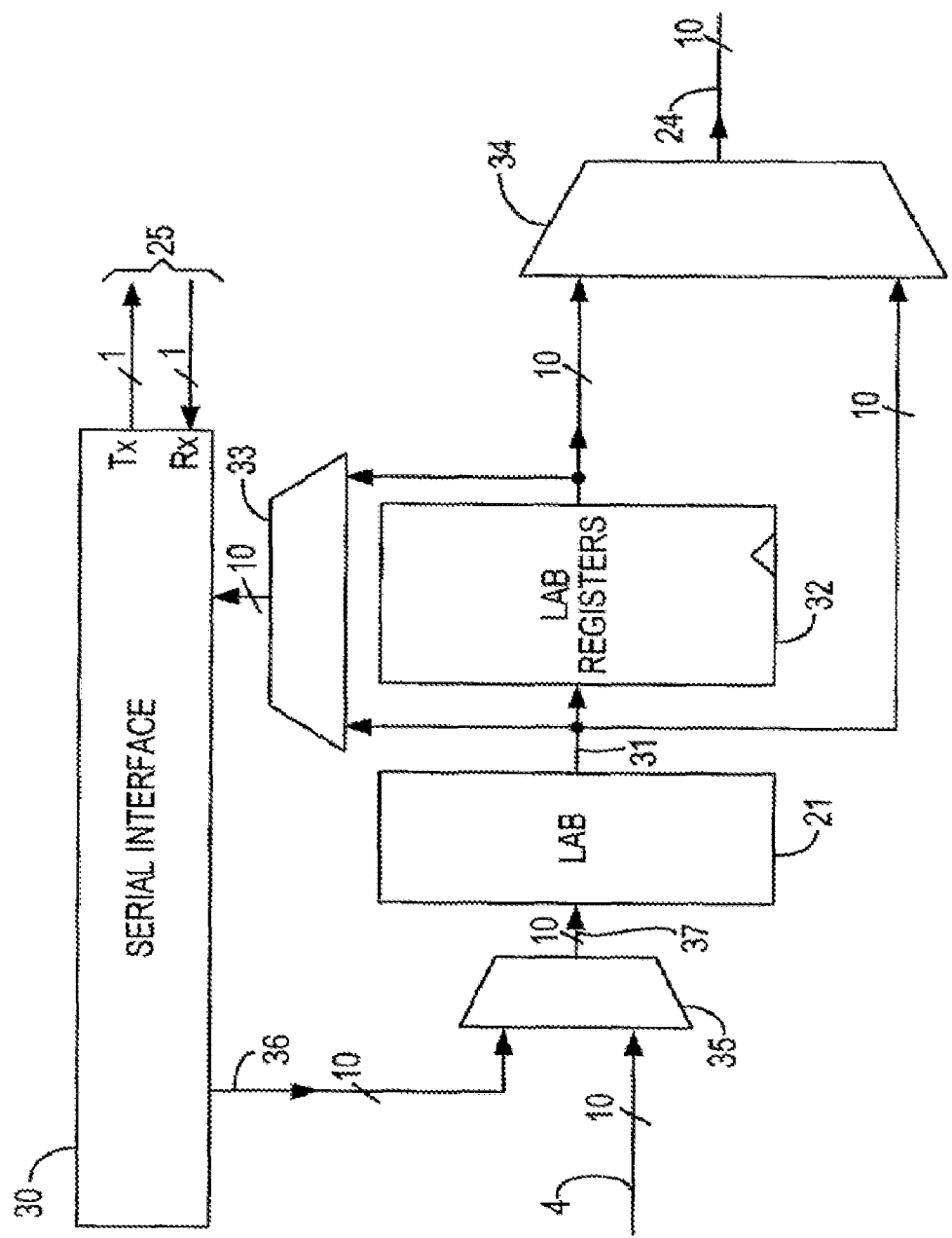
FIG. 3 is a schematic diagram of the association of a serial interface with a logic region in accordance with the present invention.

FIG. 2 shows a representative portion of PLD 10, including a plurality of LABs 21, embedded memory 22 and an I/O block 23, all interconnected by both conventional parallel interconnect 24 and serial interconnect 25. Each of LABs 21, embedded memory 22 and I/O block 23 has a serial interface 30. FIG. 3 shows one embodiment of how serial interface 30 may be connected to a LAB 21, as an example, with the ability either to use serial interface 30 and serial interconnect 25, or to use parallel interconnect 24.

As seen in FIG. 3, outputs 31 of LAB 21 are directed to output registers 32, multiplexer 33 and multiplexer 34. Multiplexer 34 selectably connects outputs 31 or the outputs of register 32 to parallel interconnect 24, while multiplexer 33 selectably connects outputs 31 or the outputs of register 32 to serial interconnect 25. On the input side, multiplexer 35 selectably connects parallel interconnect 24 or the deserialized output 36 of serial interface 30 to inputs 37 of LAB 21.

Although FIG. 2 shows serial interface 30 associated with individual LABs 21, embedded memory 22 and I/O block 23, serial interface 30 may be associated with other kinds of regions such as GOLs. For maximum flexibility in implementing user logic designs, whatever kinds of regions are associated with serial interface 30, preferably all regions of those kinds are associated with a serial interface 30. However, in alternate embodiments, not all regions of that kind in a particular PLD 10 are necessarily associated with a serial interface 30.

In the embodiment shown in FIG. 2, I/O block 23 is associated with a serial interface 30. This is so even where I/O block 23 may include a serial interface for communication outside PLD 10, which converts the outside serial signals into parallel signals, only to have serial interface 30 convert them once again to serial signals. Of course, the serial interface for signalling outside PLD 10 is likely more complicated than serial interface 30 because it must be capable of operating asynchronously with a remote interface, rather than only with other serial interfaces 30 on the same device sharing a common clock (as described below).

Figure 4:
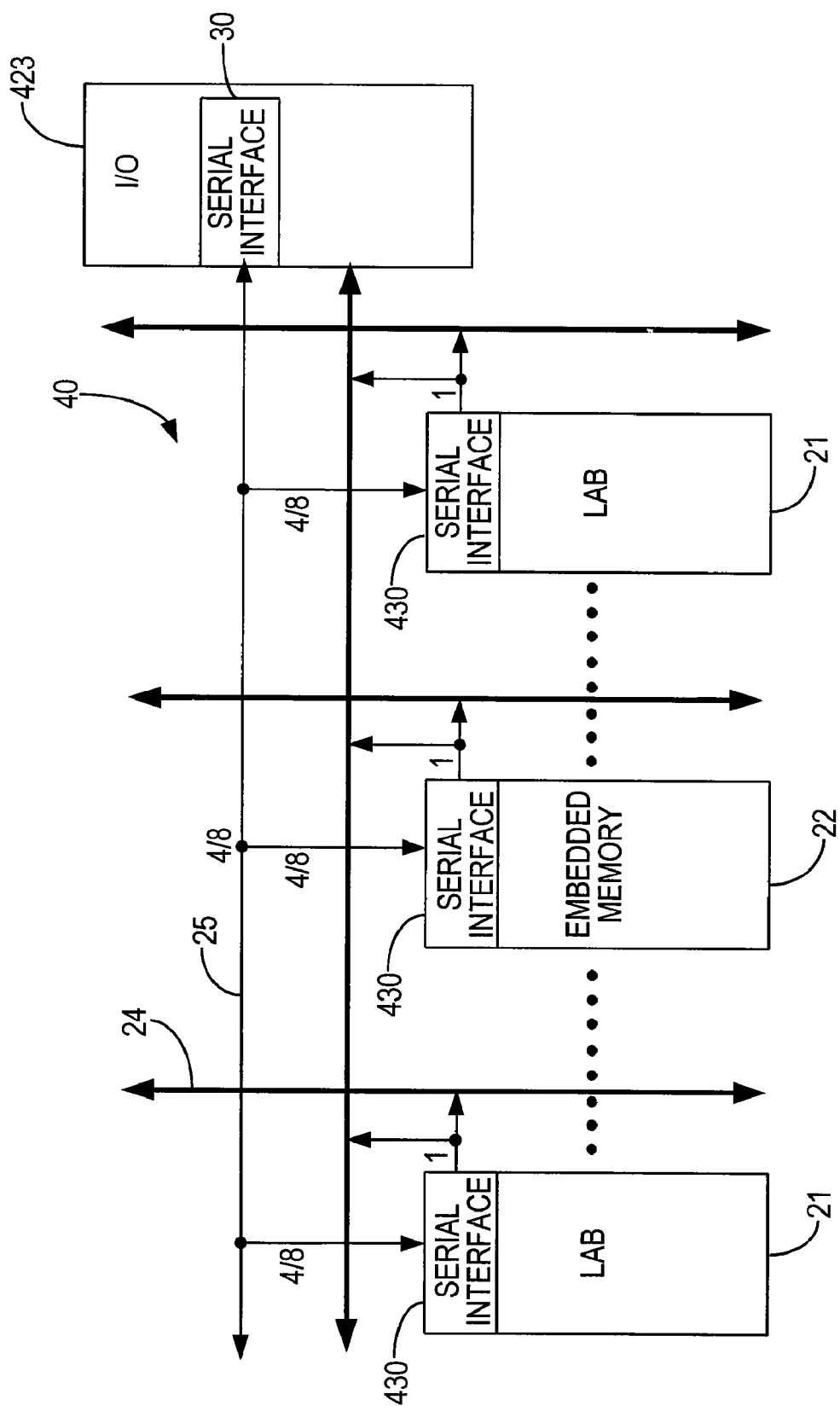
FIG. 4 is a schematic diagram of a representative portion of an alternate embodiment of a programmable logic device incorporating the present invention.

However, in the alternative embodiment 40 shown in FIG. 4, I/O blocks 423 are not provided with serial interfaces for external signalling. One or more I/O blocks 423 are provided with serial interfaces 30 so that if parallel signals are received from outside PLD 10, they can be converted to serial signals for internal signalling. However, if serial signals are received from outside PLD 10 by an I/O block 423, those serial signals are simply passed along to the various functional blocks (LABs 21, embedded memory 22, etc.). In such an embodiment, the I/O blocks 423 have the simple serial interfaces 30 described above, which operate synchronously, because they need only convert and pass along parallel signals from external sources (or convert internal serial signals to parallel signals for external destinations). In such an embodiment, I/O blocks 423 are simpler, because they need be designed for only true I/O functions (buffering, etc.) without any external serial interface, clock recovery, etc. However, the individual serial interfaces 430 in this embodiment must be more complex because they must include be able to operate asynchronously with external sources and destinations. While in such a case, I/O blocks 423 are allowed to be simply I/O blocks, the number of internal serial interfaces 430 may be so much larger that it is better to have the more complex I/O blocks 23 than to distribute large numbers of complex serial interfaces 430.

Figure 5:
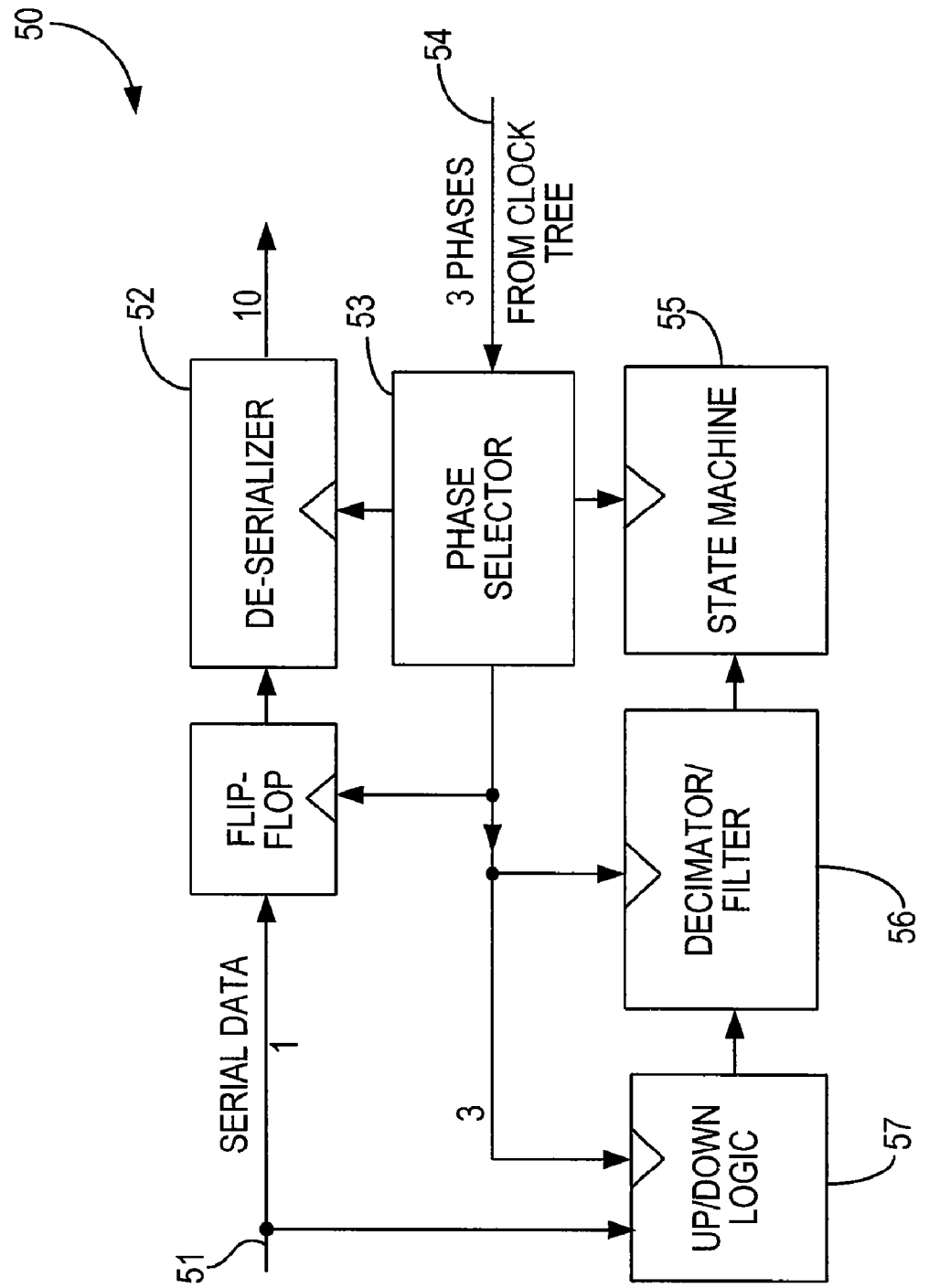
FIG. 5 is a schematic diagram of one preferred embodiment of a serial interface in accordance with the present invention.

One embodiment 50 of the deserializer portion of a serial interface 30 according to the invention is shown in FIG. 5. Serial interface 50 preferably is DPLL-based. Serial data enters at 51 and is deserialized into, e.g., 10-bit words by deserializer 52 under the control of phase selector 53 which selects one of three clock phases of synchronous device clock 54. Phase selector 53 itself is controlled by state machine 55 which receives as inputs the output of a decimator/filter 56 based on majority voting, and receiving serial data 51 via UP and DOWN shift registers 57. The UP/DOWN logic 57 can be arranged as a $3x$ sampler, with decimator/filter 56 as a deserializer. Alternatively (not shown), the functions of decimator/filter 56 and UP/DOWN shift registers 57 can be subsumed within the logic of state machine 55.

Figure 6:
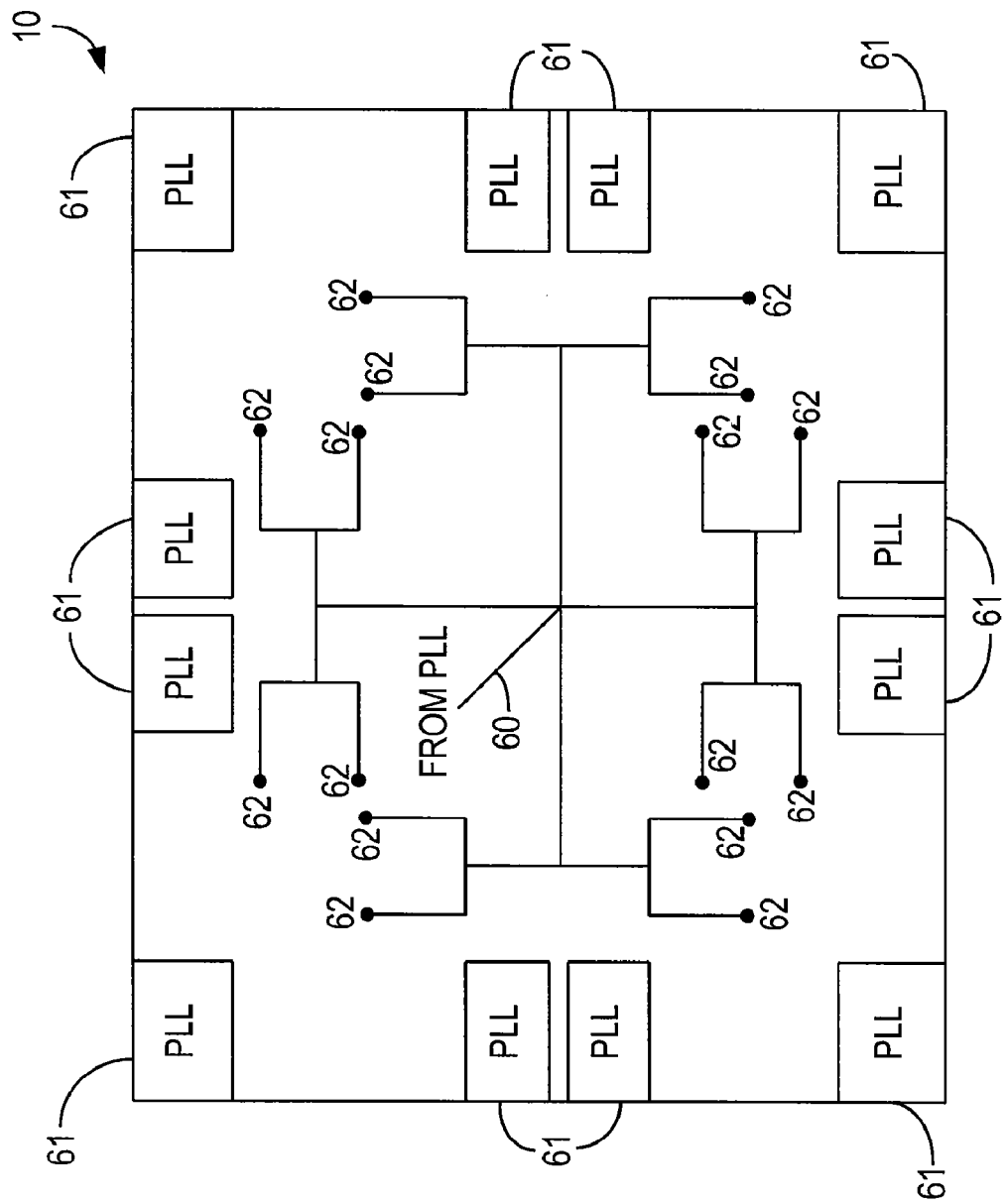
FIG. 6 is a schematic diagram showing the distribution of a common clock source on a programmable logic device.

Regardless of the whether PLD 10 includes internal serial interfaces 30 or internal serial interfaces 430, synchronous clock distribution to all serial interfaces 30, 430 is desirable. A clock tree such as clock tree 60 of FIG. 6, as is well known can be used for synchronous clock distribution from the global PLL clock sources 61 at the edge of the device (number and placement in FIG. 6 are illustrative only). Such clock trees are designed so that the distance from the global PLL to any node 62, representing a functional block on PLD 10, is substantially the same.

It should be apparent that many variations of the present invention are possible. For example, serial interfaces 30, 430 can operate at double data rates. A clock trees with eight phases at 3.25 GHz may be provided, with at least some of serial interfaces 30, 430 recovering data at twice that rate. A 6.5 GHz clock could allow a 32-bit data bus to operate at 200 MHz (32×0.2 GHz=6.4 GHz). According to a less extreme example, with an eight-phase clock at 1.56 GHz, a doubled data rate (3.12 GHz) could allow the transfer of 32 bits at close to 100 MHz (32×0.1 GHz=3.2 GHz).

As discussed above, the invention can provide significant power savings. PLD power consumption in 90 nm and smaller semiconductors is dominated by consumption in the interconnect resources. According to average estimates, interconnect consumes 70% of device power in 90 nm devices. With a conservative linear extrapolation, interconnect could consume 85% of the power used by PLDs fabricated with 45 nm processes. Moreover, some studies show that most of the interconnect power is consumed by global interconnect lines, which are most susceptible to replacement with serial interconnect in accordance with this invention.

As discussed above, a key component of interconnect power is coupling capacitance, which may be as much as 68% of total capacitance in 70 nm devices. This coupling can be reduced by about 50% by increasing minimum line-to-line spacing by a factor of four. Overall PLD power thus could be reduced by 43%. Assuming an extreme case of a 10:1 serialization/deserialization ratio, potentially all of the interconnect could be replaced by serial interconnect lines, which would require only 10% as many interconnect lines, plus line spacing equivalent to another 10% for isolation of the aforementioned 10%. This would result in the aforementioned maximum power savings of 43% for the entire PLD, with average savings of 30%.

Figure 7:
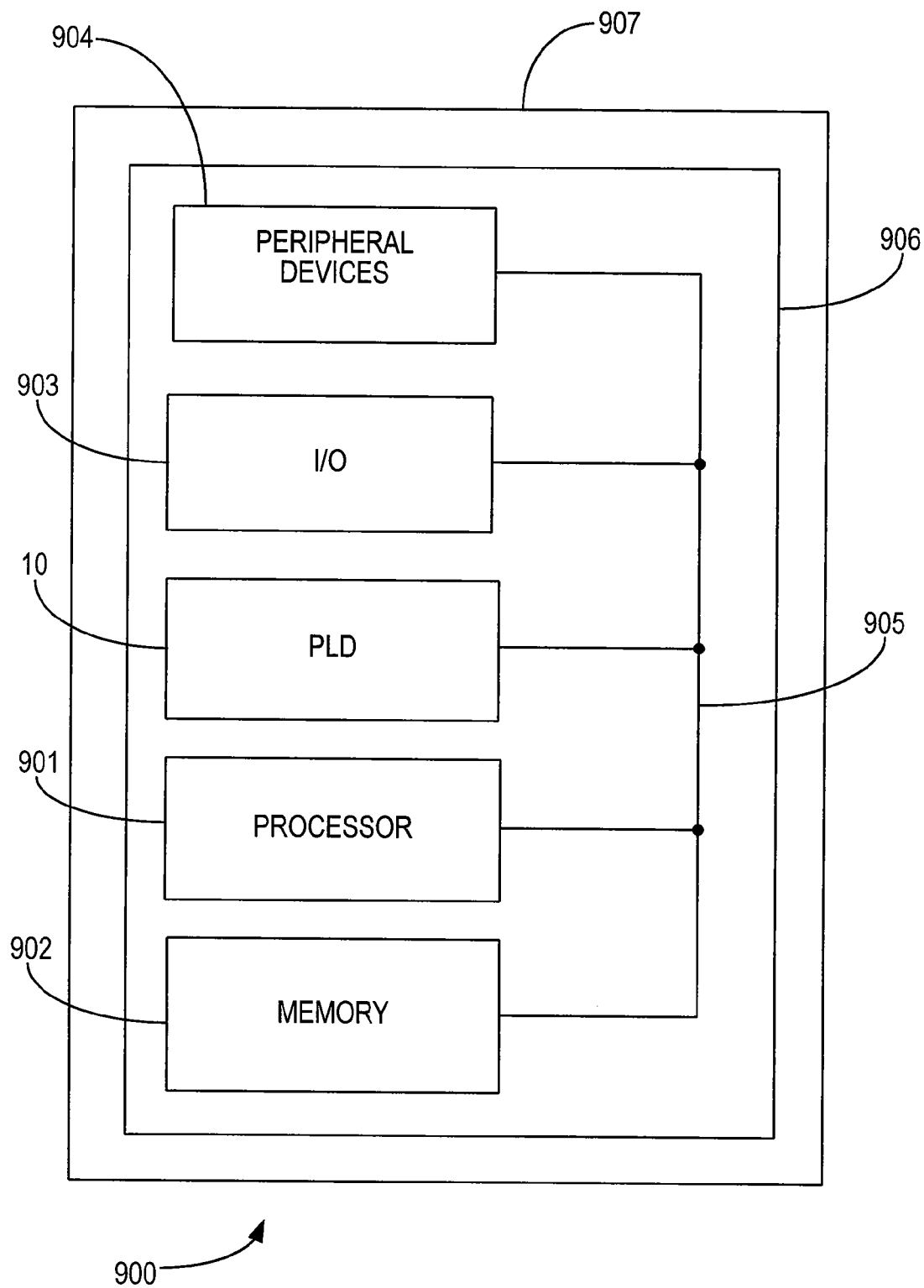
FIG. 7 is a simplified block diagram of an illustrative system employing a programmable logic device incorporating a serial interface in accordance with the present invention.

A PLD 10 incorporating serial interconnect according to the present invention may be used in many kinds of electronic devices. One possible use is in a data processing system 900 shown in FIG. 7. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 10 can be used to perform a variety of different logic functions. For example, PLD 10 can be configured as a processor or controller that works in cooperation with processor 901. PLD 10 may also be used as an arbiter for arbitrating access to a shared resources in system 900. In yet another example, PLD 10 can be configured as an interface between processor 901 and one of the other components in system 900. It should be noted that system 900 is only exemplary, and that the true scope and spirit of the invention should be indicated by the following claims.

Various technologies can be used to implement PLDs 10 as described above and incorporating this invention.

Figure 8:
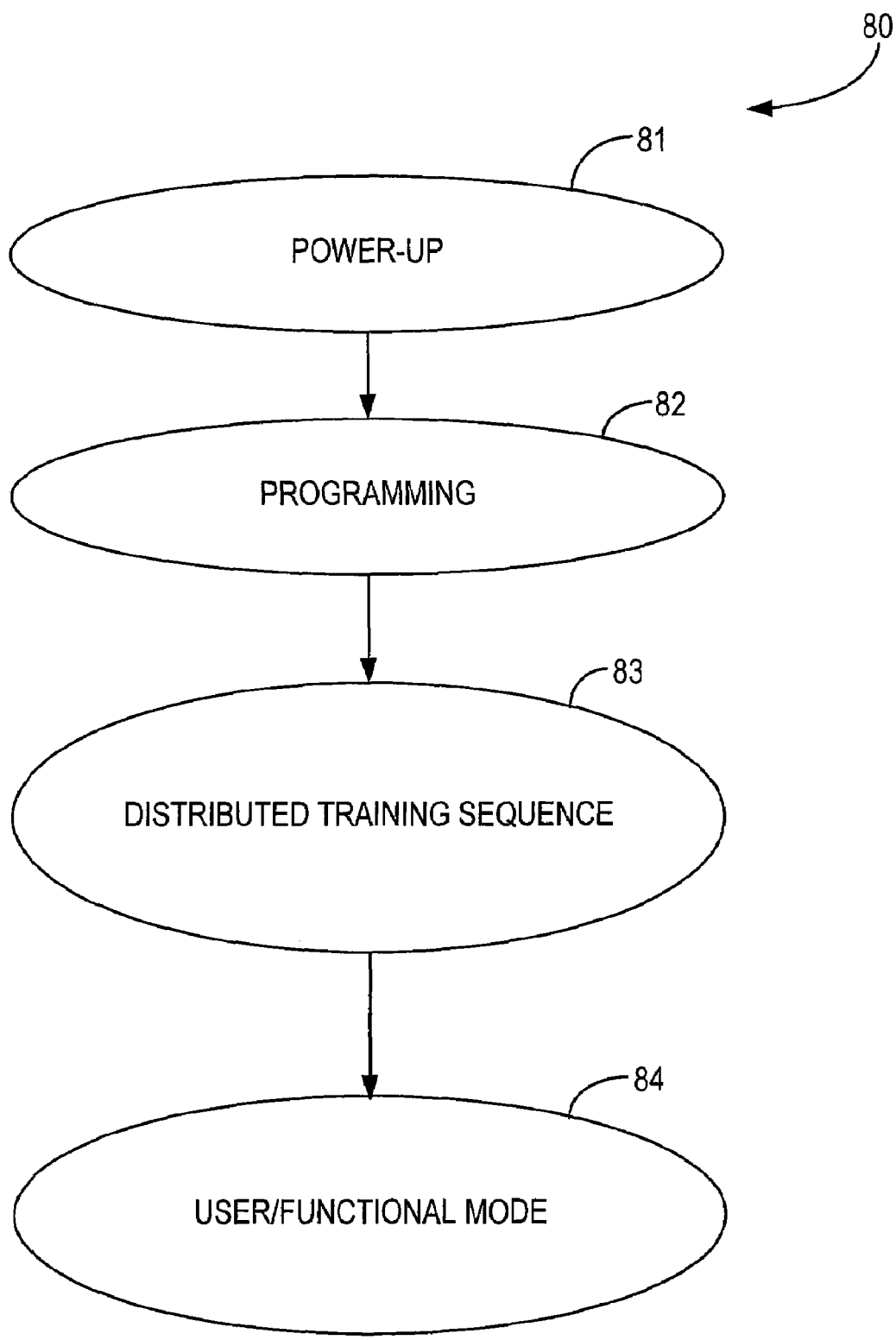
FIG. 8 is a flow diagram of a method according to the present invention of operating a programmable logic device.

A preferred method 80 of configuring PLD 10 is shown in FIG. 8. Method 80 recognizes that although serial interfaces 30, 430 may be provided throughout PLD 10, in as many as all functional blocks on PLD 10, not all of those serial interfaces 30, 430 will be used by every user logic design. Therefore, when configuring PLD 10, it is better to configure the user logic first and then train only those serial interfaces 30, 430 that are being used, rather than trying to train all serial interfaces 30, 430. Thus, method 80 starts at power-up 81, followed by loading of the user programming at 82 into the configuration registers from the nonvolatile configuration storage, and preferably only then, when the usage of serial interfaces 30, 430 is established, followed by serial interface training sequences at 83. User mode is preferably then entered at 84.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A programmable logic device comprising:
   groupings of programmable logic resources;
   programmable input/output resources; and
   programmable interconnect resources for conveying signals among said groupings of programmable logic resources and between said programmable logic resources and said programmable input/output resources; wherein:
   each of at least two portions of said programmable logic device comprises a serial interface;

said programmable interconnect resources comprise at least one serial interconnect between said serial interfaces of said at least two portions of said programmable logic device; and each one of said serial interfaces operates synchronously with each other one of said serial interfaces over said at least one serial interconnect.

2. The programmable logic device of claim 1 wherein at least one of said two portions comprises one of said groupings of programmable logic resources.

3. The programmable logic device of claim 1 wherein at least one of said two portions comprises one of said programmable input/output resources.

4. The programmable logic device of claim 1 wherein at least one of said two portions comprises a portion of said programmable interconnect resources.

5. The programmable logic device of claim 1 wherein each of said portions comprises one said serial interface.

6. The programmable logic device of claim 5 wherein each said serial interface comprises a phase-locked loop.

7. The programmable logic device of claim 6 wherein said phase-locked loop is a digital phase-locked loop.

8. The programmable logic device of claim 1 comprising a common clock source for said serial interfaces.

9. The programmable logic device of claim 8 further comprising a clock tree for distributing said common clock source to said serial interfaces.

10. The programmable logic device of claim 8 wherein said common clock source is onboard said programmable logic device.

11. A digital processing system comprising:
processing circuitry;
a memory coupled to said processing circuitry; and
a programmable logic device as defined in claim 1 coupled to the processing circuitry and the memory.

12. A printed circuit board on which is mounted a programmable logic device as defined in claim 1.

13. The printed circuit board defined in claim 12 further comprising:
memory circuitry mounted on the printed circuit board and coupled to the programmable logic device.

14. The printed circuit board defined in claim 13 further comprising:
processing circuitry mounted on the printed circuit board and coupled to the memory circuitry.

15. A method of configuring a programmable logic device, said programmable logic device having groupings of programmable logic resources, programmable input/output resources, and programmable interconnect resources for conveying signals among said groupings of programmable logic resources and between said programmable logic resources and said programmable input/output resources, said programmable interconnect resources comprise at least one serial interconnect between at least two portions of said programmable logic device, said method comprising:

on power-up of said programmable logic device, loading configuration data to implement a user configuration, including programming said programmable interconnect resources to use at least one of said at least one serial interconnect for synchronous serial communication between said at least two portions; and after said loading, training, for said synchronous serial communication, each said at least one of said at least one serial interconnect used by said user configuration.

16. The method of claim 15 further comprising entering user mode after said training.

17. An integrated circuit device comprising:
groupings of circuits;
input/output resources; and
programmable interconnect resources for conveying signals among said groupings of circuits and between said groupings of circuits and said input/output resources; wherein:
each of at least two portions of said integrated circuit device comprises a serial interface;
said programmable interconnect resources comprise at least one serial interconnect between said serial interfaces of said at least two portions of said integrated circuit device; and
each one of said serial interfaces operates synchronously with each other one of said serial interfaces over said at least one serial interconnect.

18. The integrated circuit device of claim 17, wherein said integrated circuit device comprises a programmable logic device.

19. A programmable logic device comprising:
programmable interconnect resources and serial interfaces; wherein:
said programmable interconnect resources comprise at least one serial interconnect between said serial interfaces; and
each one of said serial interfaces operates synchronously with each other one of said serial interfaces over said at least one serial interconnect.

* * * * *